(12) United States Patent
Tamura et al.

(10) Patent No.: US 7,720,124 B2
(45) Date of Patent: May 18, 2010

(54) SEMICONDUCTOR DEVICE AND FABRICATION METHOD THEREOF

(75) Inventors: Satoshi Tamura, Osaka (JP); Norio Ikedo, Osaka (JP)

(73) Assignee: Panasonic Corporation, Osaka (JP)

( * ) Notice: Subject to any disclaimer, the term of this patent is extended or adjusted under 35 U.S.C. 154(b) by 277 days.

(21) Appl. No.: 11/363,944

(22) Filed: Mar. 1, 2006

(65) Prior Publication Data
US 2006/0197104 A1 Sep. 7, 2006

(30) Foreign Application Priority Data
Mar. 3, 2005 (JP) .............................. 2005-058385

(51) Int. Cl.
*H01S 5/00* (2006.01)
(52) U.S. Cl. ................................. 372/46.011
(58) Field of Classification Search ............. 372/43.01, 372/45.01, 46.01, 46.015, 46.011
See application file for complete search history.

(56) References Cited

U.S. PATENT DOCUMENTS

| | | | | |
|---|---|---|---|---|
| 5,793,061 A | * | 8/1998 | Ohuchi et al. ................. 257/96 |
| 5,828,684 A | * | 10/1998 | Van de Walle ......... 372/45.011 |
| 5,987,048 A | * | 11/1999 | Ishikawa et al. .......... 372/46.01 |
| 6,031,858 A | * | 2/2000 | Hatakoshi et al. ......... 372/46.01 |
| 6,242,761 B1 | * | 6/2001 | Fujimoto et al. ............... 257/94 |
| 6,377,598 B1 | * | 4/2002 | Watanabe et al. ......... 372/46.01 |
| 6,706,542 B1 | * | 3/2004 | Geva et al. ...................... 438/7 |
| 6,764,870 B2 | * | 7/2004 | Okumura ..................... 438/46 |
| 2003/0025123 A1 | * | 2/2003 | Onishi .......................... 257/102 |
| 2005/0221515 A1 | * | 10/2005 | Yanashima et al. ............ 438/21 |

FOREIGN PATENT DOCUMENTS

JP 2003-142780 5/2003
WO WO2007103419 A2 * 9/2007

* cited by examiner

*Primary Examiner*—Minsun Harvey
*Assistant Examiner*—Joshua King
(74) *Attorney, Agent, or Firm*—McDermott Will & Emery LLP

(57) ABSTRACT

A semiconductor device includes a first nitride semiconductor layer formed on a substrate and a second nitride semiconductor layer formed on the first nitride semiconductor layer so as to be in contact with the first nitride semiconductor layer. The first nitride semiconductor layer contains a p-type impurity. The second nitride semiconductor layer contains an n-type impurity and a p-type impurity. In the second nitride semiconductor layer, the concentration of the n-type impurity is higher than the concentration of the p-type impurity.

9 Claims, 6 Drawing Sheets

SEMICONDUCTOR DEVICE AND FABRICATION METHOD THEREOF

CROSS-REFERENCE TO RELATED APPLICATIONS

This application claims priority under 35 U.S.C. 119(a) on Japanese Patent Application No. 2005-58385 filed on Mar. 3, 2005. The entire contents of Japanese Patent Application No. 2005-58385 and Japanese Patent Application No. 2006-35078 filed on Feb. 13, 2006 are hereby incorporated by reference.

BACKGROUND OF THE INVENTION

1. Field of the Invention

The present invention relates to a semiconductor device fabricated using a III-V nitride semiconductor material and specifically to a semiconductor device including an n-type nitride semiconductor layer grown over a p-type nitride semiconductor layer and a fabrication method thereof.

2. Description of the Prior Art

As a light source for high-density optical discs, a violet-range laser light source, which is capable of emitting light in a short wavelength range to form a converged light spot of a small diameter on optical discs as compared with red-range light and infrared light and therefore effective in improving the recording density of optical discs, has been demanded.

Presently, to realize violet-range laser light, a semiconductor laser element fabricated using a III-V nitride semiconductor, such as gallium nitride (GaN), or the like, has been developed.

FIG. 10 is a cross-sectional view of a conventional nitride semiconductor laser element. The semiconductor laser element shown in FIG. 10 includes an n-type GaN layer 102, an n-type cladding layer 103 of n-type AlGaN, an n-type guide layer 104 of n-type GaN, a MQW active layer 105 of InGaN, an overflow suppressing layer 106 of p-type AlGaN, a p-type guide layer 107 of p-type GaN, an n-type current confinement layer 108 of n-type AlGaN which has an opening 108a serving as a current waveguide, a p-type guide layer 109 of p-type GaN, a p-type cladding layer 110 of p-type AlGaN, and a p-type contact layer 111 of p-type GaN, which are sequentially epitaxially grown over a substrate 101 of n-type GaN.

An electric current injected to the laser element does not flow in the n-type current confinement layer 108 but flows through the opening 108a formed in the n-type current confinement layer 108. Light generated in the MQW active layer 105 is confined by the difference between the refractive index of the n-type current confinement layer 108 and the refractive index of the p-type guide layer 109 which is greater than that of the n-type current confinement layer 108. The current confining structure by a pn junction and a light confining structure by a hetero junction are integrally referred to as a buried structure.

To form the above-described buried structure, generally, magnesium (Mg) at a concentration of about $5 \times 10^{18}$ cm$^{-3}$ to $20 \times 10^{18}$ cm$^{-3}$ is added as a p-type dopant to the p-type semiconductor layers, e.g., the p-type guide layer 107, and silicon (Si) at a concentration of about $1 \times 10^{18}$ cm$^{-3}$ to $4 \times 10^{18}$ cm$^{-3}$ is added as an n-type dopant to the n-type semiconductor layers, e.g., the n-type current confinement layer 108.

However, the above-described conventional buried-type semiconductor laser element has the following problems.

As described above, magnesium (Mg) at a concentration of about $5 \times 10^{18}$ cm$^{-3}$ to $20 \times 10^{18}$ cm$^{-3}$ is added to the p-type overflow suppressing layer 106 and the p-type guide layer 107. Further, silicon (Si) at a concentration of about $1 \times 10^{18}$ cm$^{-3}$ to $4 \times 10^{18}$ cm$^{-3}$ is added to the n-type current confinement layer 108 formed over the p-type guide layer 107.

In general, the n-type current confinement layer 108 having such a structure is considered to have a current confinement function. However, in some actually-fabricated buried-type laser elements, the n-type current confinement layer 108 fails to perform the current confinement function, an insufficiency of the current confinement function disables the element to work as a laser element, or the laser characteristics are deteriorated.

SUMMARY OF THE INVENTION

An objective of the present invention is to solve the above-described conventional problems and provide a semiconductor device including an n-type nitride semiconductor layer formed on a p-type nitride semiconductor layer wherein the n-type nitride semiconductor layer exhibits its original n-type conductivity such that the semiconductor device achieves excellent operational characteristics.

After having conducted various researches and experiments, the present inventors found the cause that inhibits the n-type current confinement layer from sufficiently performing the current confinement function.

Although Mg is not intentionally added as a p-type dopant to the n-type current confinement layer 108, Mg is detected in the n-type current confinement layer 108 in an evaluation with a SIMS (secondary ion mass spectrometer). The distribution of Mg in the n-type current confinement layer 108 has a gradient such that the concentration of Mg is highest in the initial phase of growth and gradually decreases along with the advance of growth. This is because, after the formation of the p-type guide layer 107, Mg remaining in a reaction chamber or on the surface of a sample is mixed in the n-type current confinement layer 108 during its growth or because Mg is transferred from the p-type guide layer 107 by thermal diffusion. As a result, the n-type current confinement layer 108 includes Mg at a concentration equivalent to or higher than the concentration of Si.

Considering that the activation yield of Si as an n-type carrier is 90% or more and the activation yield of Mg as a p-type carrier is about 10%, even the n-type current confinement layer 108 containing both Si and Mg at the same concentration is generally expected to exhibit n-type characteristics and perform a current confinement function. However, in an actually-fabricated sample wherein the n-type current confinement layer 108 contained Si at the concentration of $4.0 \times 10^{18}$ cm$^{-3}$ and Mg at the concentration of about $1 \times 10^{18}$ cm$^{-3}$ to $8 \times 10^{18}$ cm$^{-3}$, the current confinement function was insufficient. Herein, the concentration of Mg was $8 \times 10^{18}$ cm$^{-3}$ in the initial phase of growth and $1 \times 10^{18}$ cm$^{-3}$ at the end of growth.

In view of the above, the present inventors have reached the knowledge that the current confinement function performed by an n-type semiconductor layer having a buried structure can be improved by reducing the amount of a p-type dopant introduced into a p-type semiconductor layer formed before the growth of the n-type semiconductor layer, by providing an intermission after the growth of the p-type semiconductor layer before the start of growth of the next n-type semiconductor layer, or by cleaning the inside of the reaction chamber before the start of growth of the n-type semiconductor layer. That is, even if the activation yield of Mg is a ⅑ of the activation yield of Si, the concentration of Si needs to be set higher than that of Mg.

The present invention was conceived based on the above knowledge and is specifically realized by the following features.

A semiconductor device according to the present invention comprises: a substrate; a first nitride semiconductor layer formed over the substrate, the first nitride semiconductor layer containing a p-type impurity; and a second nitride semiconductor layer formed on the first nitride semiconductor layer to be in contact with the first nitride semiconductor layer, the second nitride semiconductor layer containing an n-type impurity and a p-type impurity, wherein in the second nitride semiconductor layer, the concentration of the n-type impurity is higher than the concentration of the p-type impurity.

In the semiconductor device of the present invention, in the second nitride semiconductor layer which contains the n-type impurity and the p-type impurity, the concentration of the n-type impurity is higher than the concentration of the p-type impurity. Therefore, when the n-type second semiconductor layer which is in contact with the p-type first semiconductor layer containing only the p-type impurity is used as, for example, a current confinement layer, the second semiconductor layer surely performs a current confinement function. Thus, excellent operation characteristics are achieved.

In the semiconductor device of the present invention, the second nitride semiconductor layer is preferably a current confinement layer which has an opening for allowing a current to selectively flow in the first nitride semiconductor layer.

With the above feature, an optical device having excellent operation characteristics is realized.

In the above case, the semiconductor device of the present invention preferably further comprises a third nitride semiconductor layer formed on the second nitride semiconductor layer to fill the opening, the third nitride semiconductor layer having a refractive index larger than that of the second nitride semiconductor layer.

With the above feature, the opening of the second nitride semiconductor layer serves as a light confinement region. Thus, a laser element having excellent operation characteristics is realized.

In the semiconductor device of the present invention, the concentration of the p-type impurity in the second nitride semiconductor layer is preferably $1 \times 10^{18}$ cm$^{-3}$ or less.

With the above feature, since the concentration of the p-type impurity is low, the concentration of the n-type impurity added to the second nitride semiconductor layer is decreased. Therefore, generation of cracks in the second semiconductor layer during growth is suppressed.

Preferably, the semiconductor device of the present invention further comprises a fourth nitride semiconductor layer formed under the first nitride semiconductor layer, the fourth nitride semiconductor layer containing the p-type impurity, wherein the concentration of the p-type impurity in the fourth nitride semiconductor layer is higher than the concentration of the p-type impurity in the first nitride semiconductor layer.

With the above feature, the amount of the p-type impurity added to the first nitride semiconductor layer may be reduced. Since the p-type impurity is supplied from the fourth nitride semiconductor layer due to a so-called memory effect, diffusion, or the like, during growth of the first nitride semiconductor layer over the fourth nitride semiconductor layer, the amount of the p-type impurity added to the first nitride semiconductor layer itself is greatly reduced.

In the semiconductor device of the present invention, the composition of the first nitride semiconductor layer may include indium. In the layer including indium, the diffusion coefficient of the p-type impurity, e.g., Mg, is small. Therefore, if the composition of the first nitride semiconductor layer includes indium, Mg is unlikely to diffuse in the second nitride semiconductor layer.

In the semiconductor device of the present invention, preferably, the first nitride semiconductor layer includes a first semiconductor layer formed on a substrate side and a second semiconductor layer formed between the first semiconductor layer and the second nitride semiconductor layer; and the composition of the first semiconductor layer includes indium, while the composition of the second semiconductor layer does not include indium.

With the above feature, when forming the opening in the second nitride semiconductor layer by wet etching, such as an anodic oxidation method, or the like, the second semiconductor layer which does not include indium in its composition serves as an etch stop layer.

In the semiconductor device of the present invention, the p-type impurity may be magnesium, and the n-type impurity may be silicon.

The first semiconductor device fabrication method according to the present invention comprises the steps of: (a) supplying a Group III source gas, a nitrogen source gas, and a p-type impurity source gas over a substrate to form a p-type first nitride semiconductor layer over the substrate; (b) supplying a Group III source gas, a nitrogen source gas, and a p-type impurity source gas over the first nitride semiconductor layer to form a p-type second nitride semiconductor layer on the first nitride semiconductor layer, the volume of the supplied p-type impurity source gas being smaller than the volume of the p-type impurity source gas supplied at step (a); and (c) supplying a Group III source gas, a nitrogen source gas, and an n-type impurity source gas over the second nitride semiconductor layer to form an n-type third nitride semiconductor layer on the second nitride semiconductor layer.

According to the first semiconductor device fabrication method, a Group III source gas, a nitrogen source gas, and a p-type impurity source gas are supplied over the first nitride semiconductor layer such that the volume of the supplied p-type impurity source gas is smaller than the volume of the p-type impurity source gas supplied at step (a), whereby a p-type second nitride semiconductor layer is formed on the first nitride semiconductor layer. Thereafter, the n-type third nitride semiconductor layer is formed over the second nitride semiconductor layer. Therefore, the concentration of the p-type impurity mixed in the formed third nitride semiconductor layer is decreased as compared with a case where the third nitride semiconductor layer is directly formed over the p-type first nitride semiconductor layer. Thus, when the third semiconductor layer is used as a current confinement layer, for example, the third semiconductor layer surely performs a current confinement function, and excellent operation characteristics are achieved.

Preferably, at step (b), the volume of the supplied p-type impurity source gas is 0.

With the above feature, the concentration of the p-type impurity mixed in the third nitride semiconductor layer is further reduced.

Preferably, the first semiconductor device fabrication method further comprises the steps of: (d) selectively forming an opening in the third nitride semiconductor layer after step (c); and (e) forming a fourth nitride semiconductor layer on the third nitride semiconductor layer to fill the opening, the fourth nitride semiconductor layer having a refractive index larger than that of the third nitride semiconductor layer.

With the above feature, the third nitride semiconductor layer can be formed as a current confinement layer. Further, a portion of the fourth nitride semiconductor layer which fills the opening of the third nitride semiconductor layer serves as a light confinement region. Therefore, a laser element having excellent operation characteristics is realized.

The second semiconductor device fabrication method according to the present invention comprises the steps of: (a) supplying a Group III source gas, a nitrogen source gas, and a p-type impurity source gas over a substrate to form a p-type first nitride semiconductor layer over the substrate; (b) stopping the supply of the p-type impurity source gas and decreasing the temperature of the formed first nitride semiconductor layer to a temperature lower than a formation temperature of the first nitride semiconductor layer, the resultant temperature-decreased condition being maintained; and (c) after step (b), increasing the temperature up to a formation temperature of a second nitride semiconductor layer and supplying a Group III source gas, a nitrogen source gas, and an n-type impurity source gas over the first nitride semiconductor layer to form an n-type second nitride semiconductor layer on the first nitride semiconductor layer.

According to the second semiconductor device fabrication method, the p-type first nitride semiconductor layer is first formed over the substrate. Then, the supply of the p-type impurity source gas is stopped while the temperature of the formed first nitride semiconductor layer is decreased to a temperature lower than a formation temperature of the first nitride semiconductor layer, and the resultant temperature-decreased condition is maintained. Thereafter, the temperature is increased up to a formation temperature of the second nitride semiconductor layer, and the n-type second nitride semiconductor layer is formed over the first nitride semiconductor layer. Therefore, the concentration of the p-type impurity mixed in the formed second nitride semiconductor layer is decreased. Thus, when the second semiconductor layer is used as a current confinement layer, for example, the second semiconductor layer surely performs a current confinement function, and excellent operation characteristics are achieved.

In the second semiconductor device fabrication method, the temperature at step (b) is preferably lower than a thermal degradation temperature of the first nitride semiconductor layer.

With the above feature, damage to the exposed surface of the first nitride semiconductor layer can be prevented while it is maintained at a temperature lower than the formation temperature of the nitride semiconductor layer.

In the above case, the temperature at step (b) is preferably 900° C. or lower.

The third semiconductor device fabrication method according to the present invention comprises the steps of: (a) supplying a Group III source gas, a nitrogen source gas, and a p-type impurity source gas over a substrate to form a p-type first nitride semiconductor layer over the substrate; (b) after step (a), stopping the supply of the Group III source gas and supplying a hydrogen gas over the first nitride semiconductor layer; and (c) after step (b), supplying a Group III source gas, a nitrogen source gas, and an n-type impurity source gas over the first nitride semiconductor layer to form an n-type second nitride semiconductor layer on the first nitride semiconductor layer.

According to the third semiconductor device fabrication method, the p-type first nitride semiconductor layer is first formed over the substrate. Thereafter, the supply of the Group III source gas is stopped, and a hydrogen gas is supplied over the first nitride semiconductor layer. Then, the n-type second nitride semiconductor layer is formed over the first nitride semiconductor layer. Therefore, the concentration of the p-type impurity mixed in the formed second nitride semiconductor layer is greatly reduced by cleaning with the supply of the hydrogen gas. Thus, when the second semiconductor layer is used as a current confinement layer, for example, the second semiconductor layer surely performs a current confinement function, and excellent operation characteristics are achieved.

Preferably, the second and third semiconductor device fabrication methods further comprise the steps of: (d) selectively forming an opening in the second nitride semiconductor layer after step (c); and (e) forming a third nitride semiconductor layer on the second nitride semiconductor layer to fill the opening, the third nitride semiconductor layer having a refractive index larger than that of the second nitride semiconductor layer.

With the above feature, the second nitride semiconductor layer can be formed as a current confinement layer. Further, a portion of the third nitride semiconductor layer which fills the opening of the second nitride semiconductor layer serves as a light confinement region. Therefore, a laser element having excellent operation characteristics is realized.

In the first, second and third semiconductor device fabrication methods, step (d) preferably includes forming the opening by dry etching with a gas containing chlorine.

In the first semiconductor device fabrication method, preferably, step (d) includes forming the opening by irradiating the third nitride semiconductor layer with light having a wavelength which is to be absorbed by the third nitride semiconductor layer while the third nitride semiconductor layer is soaked in a solution.

In the second and third semiconductor device fabrication methods, preferably, step (d) includes forming the opening by irradiating the second nitride semiconductor layer with light having a wavelength which is to be absorbed by the second nitride semiconductor layer while the second nitride semiconductor layer is soaked in a solution.

With the above feature, etching damage to the nitride semiconductor layer which would occur when forming the opening is eliminated.

In the above case, the solution is preferably an acid solution containing a phosphoric acid.

In the above case, the solution is preferably an alkaline solution. Herein, the alkaline solution may be a potassium hydroxide solution.

In the first semiconductor device fabrication method, the concentration of the p-type impurity in the second nitride semiconductor layer is preferably $1 \times 10^{18}$ cm$^{-3}$ or less.

In the first, second and third semiconductor device fabrication methods, preferably, the p-type impurity source gas contains magnesium, and the n-type impurity source gas contains silicon.

DESCRIPTION OF THE PREFERRED EMBODIMENTS

Embodiment

Hereinafter, an embodiment of the present invention is described with reference to the drawings.

Figure 1:
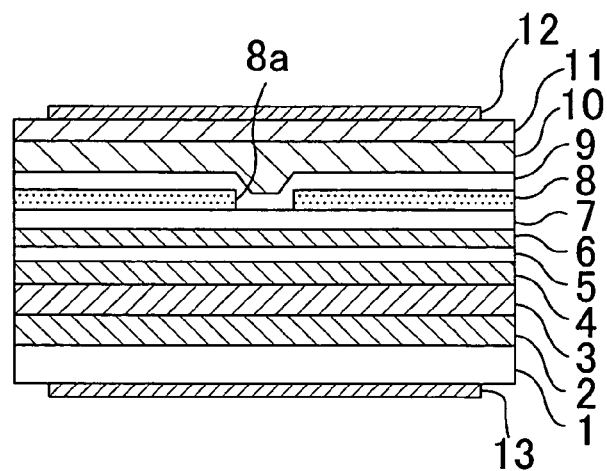
FIG. 1 is a cross-sectional view of a buried-type semiconductor laser element according to an embodiment of the present invention.

FIG. 1 shows a buried-type semiconductor element fabricated using a III-V nitride semiconductor according to an embodiment of the present invention.

The semiconductor element shown in FIG. 1 includes an n-type GaN layer 2, an n-type cladding layer 3 of n-type $Al_{0.06}Ga_{0.94}N$, an n-type guide layer 4 of n-type GaN, a multiquantum well (MQW) active layer 5 of InGaN, an overflow suppressing layer 6 of p-type $Al_{0.15}Ga_{0.85}N$, and a first p-type guide layer 7 of p-type GaN, which are sequentially epitaxially grown over a substrate 1 of n-type GaN.

Over the first p-type guide layer 7, an n-type current confinement layer 8 of n-type $Al_{0.15}Ga_{0.85}N$ which has a striped opening 8a serving as a current waveguide is provided. The semiconductor element of FIG. 1 further includes a second p-type guide layer 9 of p-type GaN, a p-type cladding layer 10 of p-type $Al_{0.06}Ga_{0.94}N$, and a p-type contact layer 11 of p-type GaN, which are sequentially epitaxially grown over the n-type current confinement layer 8 having the opening 8a.

Over the p-type contact layer 11, a p-side electrode 12 made of a metal mainly containing nickel (Ni) is provided. An n-side electrode 13 made of a metal mainly containing titanium (Ti) is provided on a surface of the substrate 1 opposite to the n-type GaN layer 2.

An electric current injected through the p-side electrode 12 flows through part of the second p-type guide layer 9 provided inside the opening 8a of the n-type current confinement layer 8. Confinement of light generated by the MQW active layer 5 is achieved by the difference in refractive index between the n-type current confinement layer 8 and the second p-type guide layer 9.

In this embodiment, a gallium nitride (GaN) substrate is used for epitaxial growth, but the present invention is not limited thereto. For example, a substrate made of sapphire (monocrystal $Al_2O_3$), silicon carbide (SiC), silicon (Si), gallium arsenide (GaAs), or the like, may be used. In the case where a material having no electrical conductivity, such as sapphire, is used, for example, an n-type contact layer needs to be provided under the n-type cladding layer 3 so as to have a partially exposed surface on which the n-side electrode 13 is formed.

A feature of this embodiment is that silicon (Si) is added as an n-type dopant at the concentration of $2.5 \times 10^{18}$ cm$^{-3}$ to the n-type current confinement layer 8. Since the n-type current confinement layer 8 is in contact with the first p-type guide layer 7, magnesium (Mg), which is a p-type dopant, is contained in the n-type current confinement layer 8. In the n-type current confinement layer 8, the concentration of Mg is lower than that of Si.

The present inventors comparatively examined the current confinement function among four combinations of different Si concentrations and Mg concentrations in the n-type current confinement layer 8.

PRESENT INVENTION

Si concentration: $2.5 \times 10^{18}$ cm$^{-3}$
Mg concentration: $0.1 \times 10^{18}$ cm$^{-3}$ to $1 \times 10^{18}$ cm$^{-3}$ Comparative Example 1

Si concentration: $1.0 \times 10^{18}$ cm$^{-3}$
Mg concentration: $1 \times 10^{18}$ cm$^{-3}$ to $8 \times 10^{18}$ cm$^{-3}$ Comparative Example 2

Si concentration: $2.5 \times 10^{18}$ cm$^{-3}$
Mg concentration: $1 \times 10^{18}$ cm$^{-3}$ to $8 \times 10^{18}$ cm$^{-3}$ Comparative Example 3

Si concentration: $4.0 \times 10^{18}$ cm$^{-3}$
Mg concentration: $1 \times 10^{18}$ cm$^{-3}$ to $8 \times 10^{18}$ cm$^{-3}$ In the example of Present Invention, the concentration of Mg mixed in the n-type current confinement layer 8 is reduced by a fabrication method of the present invention (described later). In Comparative Example 1, Comparative Example 2 and Comparative Example 3, the concentration of Mg mixed in the n-type current confinement layer 8 is high as in the conventional cases.

Figure 2:
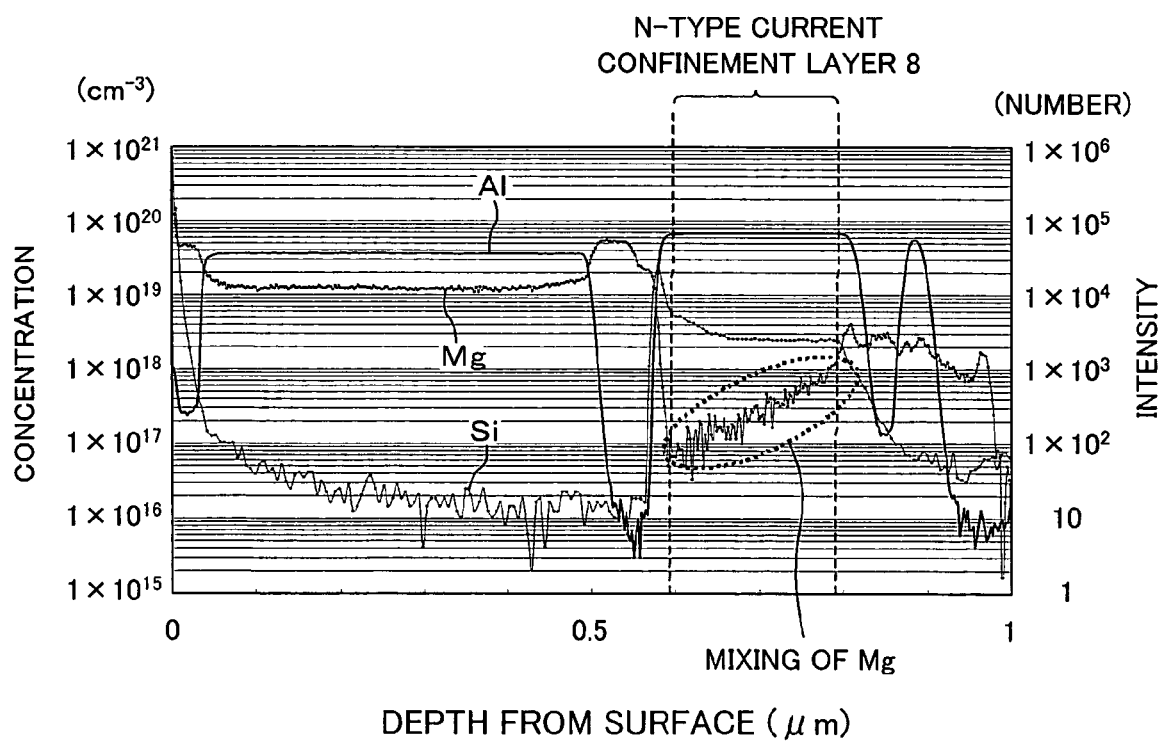
FIG. 2 is a graph illustrating an impurity profile by SIMS for magnesium (Mg) in an n-type current confinement layer included in the buried-type semiconductor laser element according to the embodiment of the present invention.

FIG. 2 shows a SIMS profile of a semiconductor device according to the present invention. As seen from FIG. 2, in the initial phase of growth of the n-type current confinement layer 8, the amount of Mg mixed therein is relatively large, and the concentration of Mg is about $1 \times 10^{18}$ cm$^{-3}$. At the end of growth of the n-type current confinement layer 8, the amount of Mg mixed therein is smaller, and the concentration of Mg is about $0.1 \times 10^{18}$ cm$^{-3}$. This trend of the profile is also the same even in the other examples where the amount of mixed Mg is large.

Among Comparative Example 1, Comparative Example 2 and Comparative Example 3, the Si concentration in the n-type current confinement layer 8 is different. In Comparative Example 1, in the n-type current confinement layer 8, the concentration of Mg mixed therein is higher than the concentration of Si added thereto over the entire extent of the layer 8 in the depth direction. In Comparative Example 2, in the n-type current confinement layer 8, the Si concentration is higher than the Mg concentration in about ¼ part of the layer 8 from the upper face in the depth direction, and in the remaining about ¾ part, the Mg concentration is higher than the Si concentration. In Comparative Example 3, in the n-type current confinement layer 8, the Si concentration is higher than the Mg concentration in about ½ part of the layer 8 from the upper face in the depth direction, and in the remaining about ½ part, the Mg concentration is higher than the Si concentration.

Figure 3:
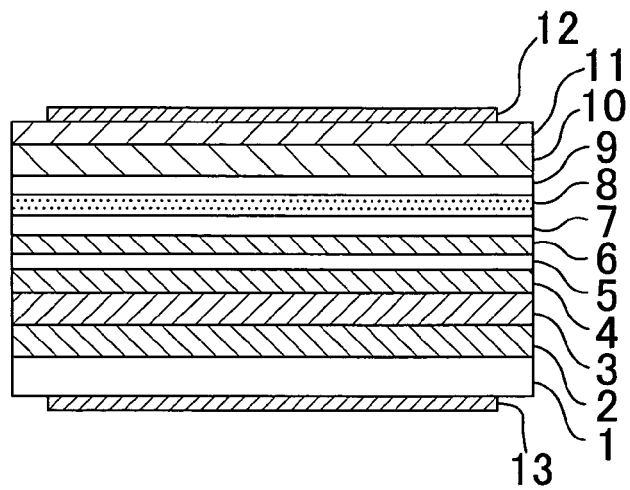
FIG. 3 is a cross-sectional view of a sample structure used for examining the current confinement function of the n-type current confinement layer included in the buried-type semiconductor laser element according to the embodiment of the present invention.

Based on the above four examples, samples having a semiconductor layered structure shown in FIG. 3, wherein the n-type current confinement layer 8 does not have the opening 8a, were prepared for evaluation of the current confinement function. In FIG. 3, the same elements as those of FIG. 1 are denoted by the same reference numerals.

In these samples, a current injected through the p-side electrode 12 flows through the n-type current confinement layer 8. If the n-type current confinement layer 8 sufficiently has the current confinement function, substantially no current flows through the semiconductor layered structure.

Figure 4:
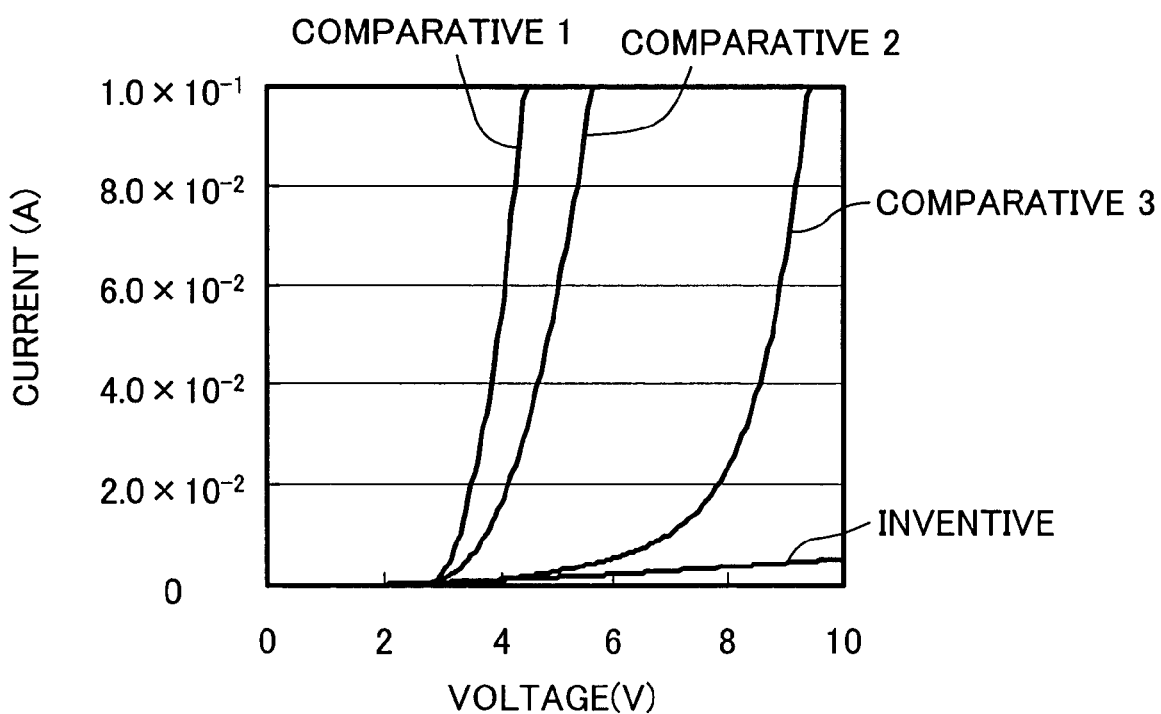
FIG. 4 is a graph illustrating the current-voltage characteristic in samples having the structure shown in FIG. 3.

FIG. 4 shows the current-voltage characteristic for the samples of Present Invention, Comparative Example 1, Comparative Example 2 and Comparative Example 3. The sample of Comparative Example 1, where the Si concentration was lower than the Mg concentration in the entire n-type current confinement layer 8, exhibited a current-voltage characteristic similar to that of a structure not including the n-type current confinement layer 8, and the n-type current confinement layer did not perform the current confinement function at all. In the samples of Comparative Example 2 and Comparative Example 3, as the region containing Si at higher concentration than Mg increased, the current confinement function improved. However, even in the sample of Comparative Example 3, a larger current flowed as the applied voltage increased, and therefore, the layer 8 was insufficient as the n-type current confinement layer. Although the current confinement function is considered to be improved by further increasing the Si concentration in the n-type current confinement layer 8, a larger number of cracks are generated in the n-type current confinement layer 8 on the other hand.

In the sample of the present invention, the concentration of Mg mixed in the n-type current confinement layer 8 was reduced such that the Si concentration was higher than the Mg concentration in the entire n-type current confinement layer 8. With this feature, substantially no current flowed through the n-type current confinement layer 8 even if the applied voltage was increased, so that sufficient current confinement function was achieved.

As described above, in a buried-type semiconductor laser element according to this embodiment, the concentration of Mg mixed in the n-type current confinement layer 8 is lower than the concentration of Si added thereto. Therefore, the n-type current confinement layer 8 performs an originally-expected function of current confinement, so that excellent device characteristics are achieved.

As previously illustrated, to further improve the current confinement function of the n-type current confinement layer 8, it is preferable to increase the concentration of Si added to the n-type current confinement layer 8. However, in the n-type current confinement layer 8 made of n-type $Al_{0.15}Ga_{0.85}N$, if the concentration of added Si is $1\times10^{18}$ $cm^{-3}$ or more, cracks are more likely to be generated as the Si concentration increases. Thus, to decrease the cracks generated in the n-type current confinement layer 8, the concentration of Mg mixed in the n-type current confinement layer 8 is desirably $1\times10^{18}$ $cm^{-3}$ or less. With this structure, the Si concentration is readily set higher than the Mg concentration such that no crack is generated in the n-type current confinement layer 8.

Hereinafter, a method for fabricating the semiconductor laser element having the above-described structure according to the present invention is described with reference to the drawings. FIG. 5A through FIG. 5D are cross-sectional views showing steps of the fabrication method of the semiconductor laser element according to an embodiment of the present invention. Herein, an MOVPE (metal organic vapor phase epitaxy) apparatus is used for growing nitride semiconductor layers. For example, trimethylgallium (TMG) is used as the source of Ga, which is the source of Group III material, trimethylaluminum (TMA) is used as the source of Al, and trimethylindium (TMI) is used as the source of In. Ammonia ($NH_3$) is used as the source of N, which is the source of Group V material. Further, monosilane ($SiH_4$) is used as the source of Si, which is the donor impurity, and cyclopentadienylmagnesium ($Cp_2Mg$) is used as the source of Mg, which is the accepter impurity. Furthermore, the carrier gas used for carrying the Group III material gases is hydrogen ($H_2$).

Figure 5A:
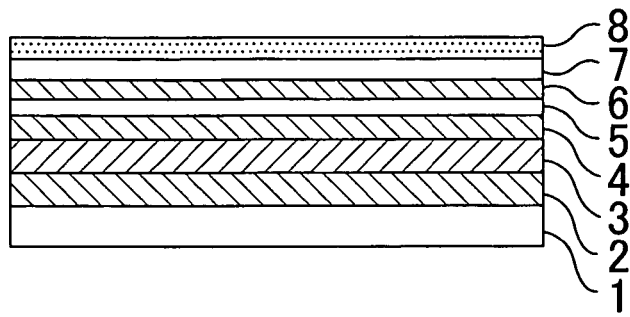
FIG. 5A through FIG. 5D are cross-sectional views showing steps of a method for fabricating a buried-type semiconductor laser element according to an embodiment of the present invention.

Referring to FIG. 5A, a n-type GaN substrate 1 having a diameter of, for example, about 5.1 cm (2 inches) is placed in a reaction chamber of the MOVPE apparatus. Over the primary surface of the substrate 1, an n-type GaN layer 2 having a thickness of 2 μm, an n-type cladding layer 3 of n-type $Al_{0.06}Ga_{0.94}N$ having a thickness of 1 μm, an n-type guide layer 4 of n-type GaN having a thickness of 0.2 μm, a MQW active layer 5 of InGaN, an overflow suppressing layer 6 of p-type $Al_{0.15}Ga_{0.85}N$ having a thickness of 0.01 μm, a first p-type guide layer 7 of p-type GaN having a thickness of 0.05 μm, and an n-type current confinement layer 8 of n-type $Al_{0.15}Ga_{0.85}N$ having a thickness of 0.15 μm are sequentially grown. Herein, the MQW active layer 5 has a composition such that the laser element is capable of emitting laser light (recombination radiation) at the wavelength of 405 nm.

When the concentration of Mg added to the p-type overflow suppressing layer 6 formed over the MQW active layer 5 is less than $8\times10^{18}$ $cm^{-3}$, the p-type overflow suppressing layer 6 fails to sufficiently produce the effect of suppressing an overflow of injected electrons, and the threshold current for laser oscillation increases. Therefore, it is necessary to add Mg at the concentration of $8\times10^{18}$ $cm^{-3}$ or more to the overflow suppressing layer 6. In this embodiment, Mg at the concentration of $1\times10^{19}$ $cm^{-3}$ is added to the overflow suppressing layer 6.

The concentration of Mg added to the first p-type guide layer 7 formed over the overflow suppressing layer 6 is lower than the Mg concentration in the overflow suppressing layer 6 and is, for example, $3\times10^{18}$ $cm^{-3}$. The concentration of Mg is controllable by the ratio of a p-type impurity gas to a Group III source gas (=the volume of an introduced p-type impurity source gas/the volume of a Group III source gas). As the value of this ratio increases, the Mg concentration in a p-type semiconductor layer increases. While the Mg concentration in the first p-type guide layer 7 has such a value, Si is added at the concentration of $2.5\times10^{18}$ $cm^{-3}$ to the n-type current confinement layer 8 formed over the first p-type guide layer 7.

Figure 5B:
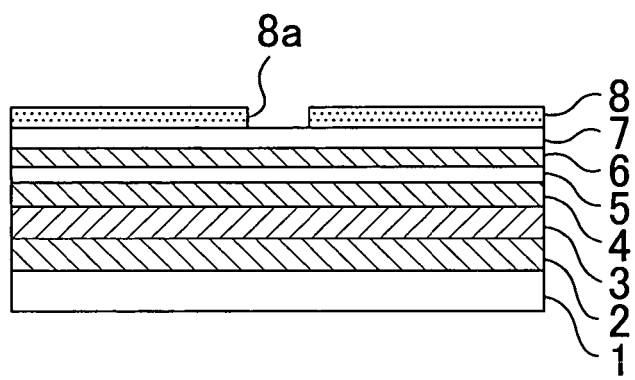

The layered structure which has been formed up to the n-type current confinement layer 8 as shown in FIG. 5A is taken out of the reaction chamber, and then, a striped opening 8a is selectively formed in the n-type current confinement layer 8 by lithography and etching so as to have an opening width of about 1.5 μm to 2.0 μm as shown in FIG. 5B. It should be noted that details of the etching method will be described later.

Then, the layered structure in which the opening 8a has been formed as shown in FIG. 5B is again placed in the reaction chamber of the MOVPE apparatus. Over the n-type current confinement layer 8, a second p-type guide layer 9 of p-type GaN having a thickness of 0.1 μm, a p-type cladding layer 10 of p-type $Al_{0.06}Ga_{0.94}N$ having a thickness of 0.5 μm, and a p-type contact layer 11 of p-type GaN having a thickness of 0.1 μm are sequentially grown such that the opening

Figure 5C:
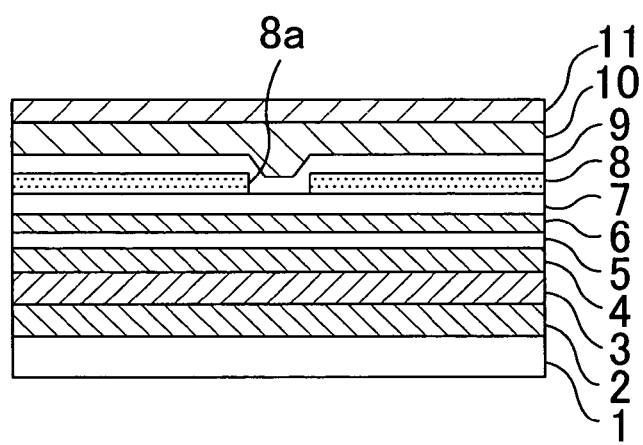

8a is filled as shown in FIG. 5C. The resultant layered structure is subjected to an activation annealing in a nitrogen atmosphere at about 780° C. for 20 minutes, whereby the resistance of the grown p-type semiconductor layers is reduced.

Figure 5D:
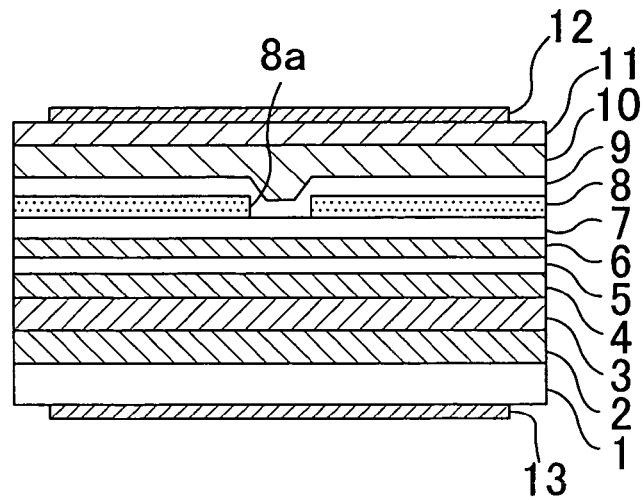

Referring to FIG. 5D, after the activation annealing, a p-side electrode 12 is formed mainly of Ni on the p-type contact layer 11 by, for example, vacuum deposition. The formed p-side electrode 12 is sintered in a nitrogen atmosphere at 650° C. for 30 minutes. Thereafter, a surface of the substrate 1 opposite to the buffer layer 2 is ground such that the substrate 1 has a thickness of about 150 μm. On the ground surface of the substrate 1, an n-side electrode 13 is formed mainly of Ti by, for example, vacuum deposition. The formed n-side electrode 13 is sintered in a nitrogen atmosphere at 600° C. for 30 seconds. After the formation of the n-side electrode 13, the substrate 1 is cleaved to obtain a buried-type violet semiconductor laser element.

Thus, according to the fabrication method of this embodiment, the Mg concentration in the first p-type guide layer 7 is lower than the Mg concentration in the p-type overflow suppressing layer 6 formed under the layer 7. With this feature, the concentration of Mg remaining on a surface of the p-type semiconductor layer or remaining in the reaction chamber after the formation of the first p-type guide layer 7 is reduced, so that the amount of Mg mixed in the n-type current confinement layer 8 grown over the first p-type guide layer 7 decreases.

Specifically, since the Mg concentration in the first p-type guide layer 7 is $3 \times 10^{18}$ cm$^{-3}$, the Mg concentration quickly decreases to about $1 \times 10^{18}$ cm$^{-3}$ in the initial phase of growth of the n-type current confinement layer 8 as shown in FIG. 2. As the n-type current confinement layer 8 is grown, the Mg concentration decreases and reaches $0.1 \times 10^{18}$ cm$^{-3}$ at the end of the growth. As a result, the current confinement function of the n-type current confinement layer 8 is improved, whereby the device characteristics are improved.

As described above, for the purpose of suppressing generation of cracks in the n-type current confinement layer 8, the concentration of Mg mixed in the n-type current confinement layer 8 is desirably $1 \times 10^{18}$ cm$^{-3}$ or less. Accordingly, the concentration of Mg in the first p-type guide layer 7 is desirably $1 \times 10^{18}$ cm$^{-3}$ or less.

Although in this embodiment Mg at the concentration of $3 \times 10^{18}$ cm$^{-3}$ is added to the first p-type guide layer 7, it is desirable to decrease the concentration of Mg mixed in the n-type current confinement layer 8 in order to further improve the current confinement function of the n-type current confinement layer 8. To this end, Mg may be intentionally refrained from being added to the first p-type guide layer 7. It should be noted that, even if Mg is intentionally refrained from being added to the first p-type guide layer 7, Mg added in the process of growing the p-type overflow suppressing layer 6 is also slightly mixed in the first p-type guide layer 7.

Hereinafter, a method for etching the n-type current confinement layer 8 to form the opening 8a is described. A typical etching method is dry etching. Examples of a dry-etching apparatus include a RIE (reactive ion etching) apparatus, an ECR (electron cyclotron resonance) etching apparatus, an ICP (inductively coupled plasma) etching apparatus, etc. A gas mainly containing chlorine may be used as the etching gas. The material of a mask formed over the n-type current confinement layer 8 except for a region corresponding to the opening 8a may be, for example, a resist material, an insulating material, such as silicon oxide (SiO$_2$), a metal mainly containing nickel (Ni), or the like.

Figure 6:
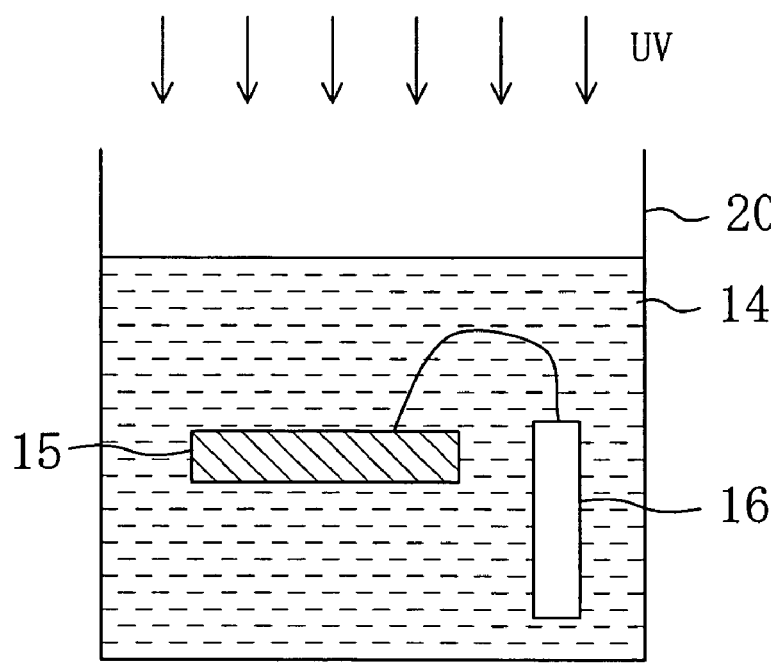
FIG. 6 is a schematic cross-sectional view showing a wet-etching step for forming an opening in the n-type current confinement layer in the buried-type semiconductor laser element fabrication method according to the embodiment of the present invention.

Alternatively, a wet-etching method may be used in place of the dry-etching method. In general, the wet etching causes less damage than the dry-etching method. FIG. 6 is a schematic cross-sectional view for illustrating the wet etching.

Referring to FIG. 6, first, a nitride semiconductor structure 15 including an n-type current confinement layer (not shown) on the upper surface of which an anode of Ti is provided and a cathode 16 of Pt electrically connected to the structure 15 are soaked in a solution 14 of, for example, potassium hydroxide (KOH) contained in a vessel 20. Examples of the solution 14 other than KOH include alkaline solutions, such as a sodium hydroxide (NaOH) solution, and the like, and acid solutions containing phosphoric acid (H$_3$PO$_4$). Then, while being soaked in the solution 14, the nitride semiconductor structure 15 is irradiated with light which is to be absorbed by the nitride semiconductor structure 15, for example, ultraviolet light. Etching of the nitride semiconductor structure 15 is realized by such a so-called anodic oxidation process. It should be noted that, in this method, a p-type nitride semiconductor is not etched although an n-type nitride semiconductor layer, e.g., the n-type current confinement layer 8, is etched. Therefore, the first p-type guide layer 7 formed under the n-type current confinement layer 8 functions as an etch stop layer, such that the opening 8a is formed with excellent controllability.

In the above example, a mercury lamp is used as the source of ultraviolet light applied to the nitride semiconductor structure 15. However, alternatively, KrF excimer laser light at the wavelength of, for example, 248 nm, which is absorbed by AlGaN, may be used instead.

The present inventors practiced the wet etching with the KOH solution on a n-type current confinement layer fabricated using a conventional fabrication method and confirmed that, when the concentration of Mg mixed in the n-type current confinement layer was higher than the concentration of Si added thereto so that the current confinement function was insufficient, the n-type current confinement layer was not etched at all or was only partially etched. This is considered to be because the current confinement layer did not actually have n-type semiconductor characteristics for the same reason of insufficient current confinement function in the conventional fabrication method.

As described above, in the semiconductor device and the fabrication method thereof according to this embodiment, in the entire n-type current confinement layer 8, the concentration of Mg externally mixed therein is lower than the concentration of Si. With this feature, the above-described wet etching process surely forms the opening 8a in the n-type current confinement layer 8 so as to expose the first p-type guide layer 7.

In the above-described embodiment, the concentration of Mg mixed in the n-type current confinement layer 8 is reduced by a fabrication method wherein the concentration of Mg in the first p-type guide layer 7 is decreased or Mg is not added to the first p-type guide layer 7, whereby the current confinement function of the n-type current confinement layer 8 is improved. However, it is possible that the resistance of the first p-type guide layer 7 itself increases as the amount of Mg added to the first p-type guide layer 7 is reduced.

In view of such, a semiconductor device wherein the concentration of Mg mixed in the n-type current confinement layer 8 is decreased without decreasing the concentration of Mg added to the first p-type guide layer 7 is described below.

(First Variation of Embodiment)

Hereinafter, the first variation of the embodiment of the present invention is described with reference the drawings.

Figure 7:
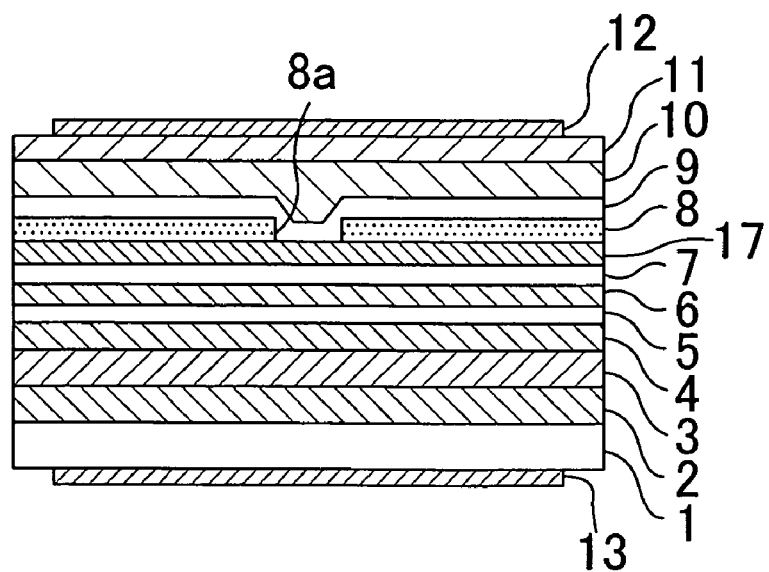
FIG. 7 is a cross-sectional view of a buried-type semiconductor laser element according to the first variation of the embodiment of the present invention.

FIG. 7 is a cross-sectional view of a buried-type semiconductor laser element according to the first variation of the embodiment of the present invention. In FIG. 7, the same elements as those of FIG. 1 are denoted by the same reference numerals, and the descriptions thereof are herein omitted. As shown in FIG. 7, the semiconductor laser element of the first variation includes a diffusion suppressing layer 17 of InGaN having a thickness of 0.01 μm between the first p-type guide layer 7 of p-type GaN and the n-type current confinement layer 8 of n-type $Al_{0.15}Ga_{0.85}N$.

Among the overflow suppressing layer 6 and the first p-type guide layer 7, magnesium (Mg) at the concentration of $1 \times 10^{19}$ cm$^{-3}$ is added to the overflow suppressing layer 6. It has been empirically known that a semiconductor made of InGaN suppresses diffusion of Mg. Although not clarified, it is considered to be because the diffusion coefficient of Mg in InGaN is relatively small as compared with those in the other nitride semiconductors. In view of such, the diffusion suppressing layer 17 of InGaN is provided between the first p-type guide layer 7 and the n-type current confinement layer 8 so that Mg added to the first p-type guide layer 7 is prevented from diffusing in the n-type current confinement layer 8. As a result, the current confinement function of the n-type current confinement layer 8 is improved, whereby the device characteristics are improved.

It should be noted that a p-type impurity (Mg) is intentionally refrained from being added to the diffusion suppressing layer 17, but the diffusion suppressing layer 17 finally contains the p-type impurity due to a so-called memory effect.

The composition ratio of In in the diffusion suppressing layer 17 is about 4% to 8% in the first variation, although it is not limited to any particular value according to the present invention.

(Second Variation of Embodiment)

Figure 8:
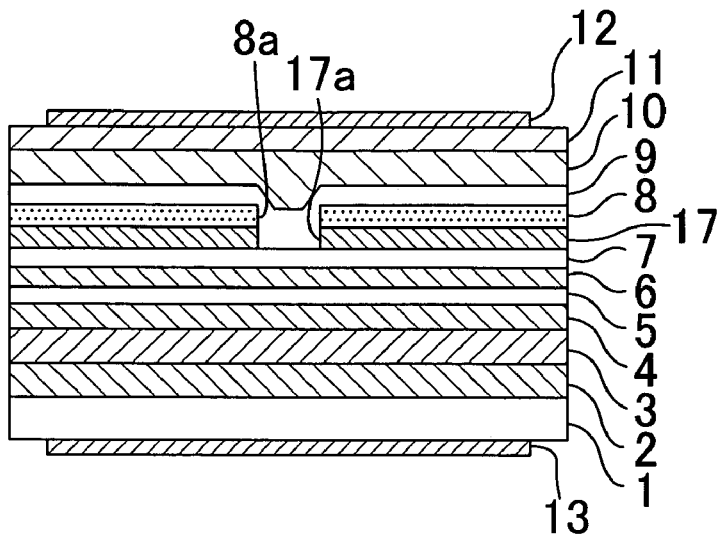
FIG. 8 is a cross-sectional view of a buried-type semiconductor laser element according to the second variation of the embodiment of the present invention.

Although the element of the first variation has the opening only in the n-type current confinement layer 8, an element of the second variation shown in FIG. 8 desirably has an opening 17a in the InGaN diffusion suppressing layer 17 under the opening 8a so as to expose the first p-type guide layer 7. This is for the purpose of preventing the diffusion suppressing layer 17 from absorbing light generated in the MQW active layer 5 at a laser oscillation wavelength of 405 nm.

(Third Variation of Embodiment)

Figure 9:
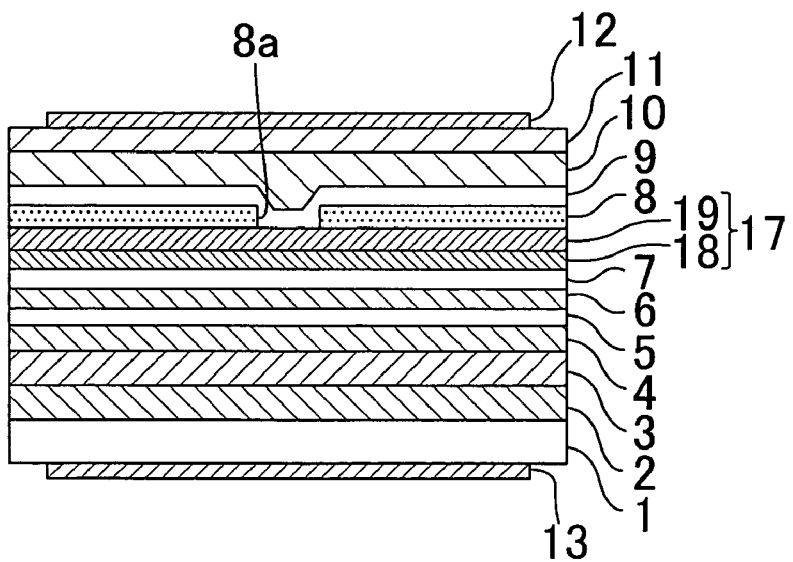
FIG. 9 is a cross-sectional view of a buried-type semiconductor laser element according to the third variation of the embodiment of the present invention.
Figure 10:
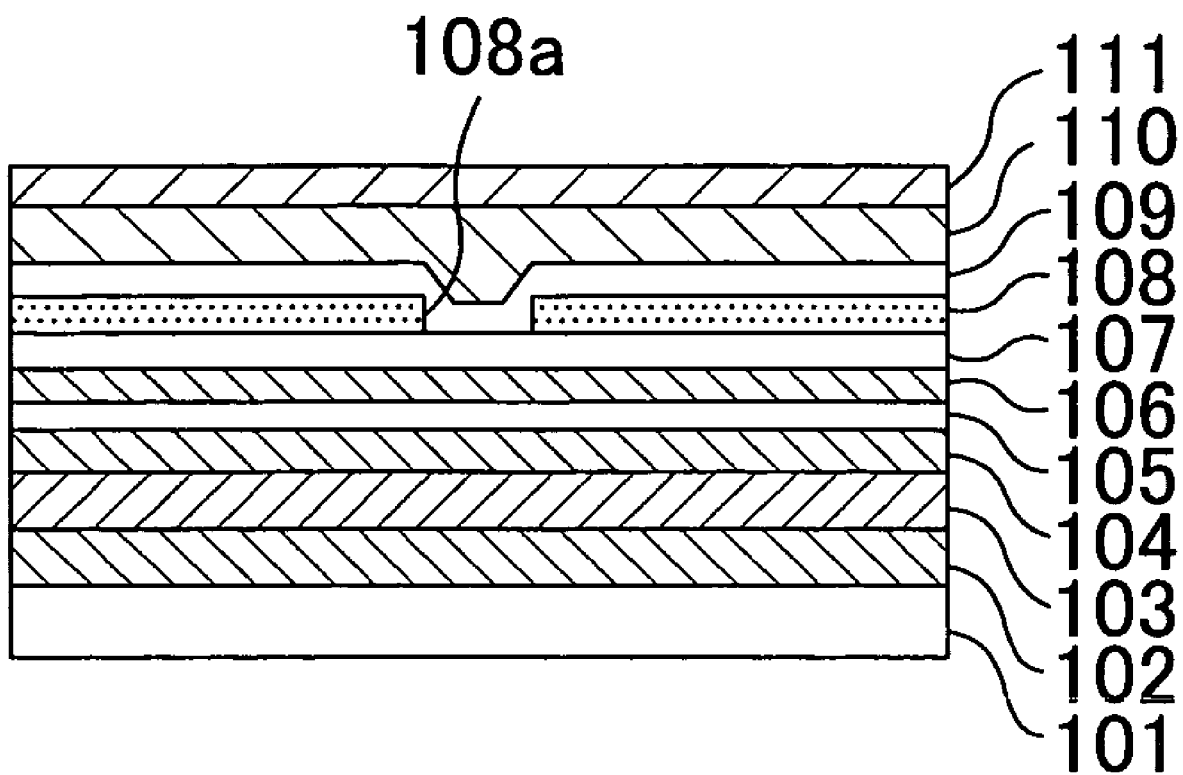
FIG. 10 is a cross-sectional view of a conventional buried-type semiconductor laser element.

Referring to FIG. 9, in a buried-type semiconductor laser element of the third variation, the diffusion suppressing layer 17 has a two-layer structure. The diffusion suppressing layer 17 of the third variation includes a first semiconductor layer 18 of InGaN having a thickness of 0.01 μm and a second semiconductor layer 19 of GaN having a thickness of 0.02 μm, which are grown sequentially from the substrate side.

In this structure, the second semiconductor layer 19 of GaN is provided under the n-type current confinement layer 8 so as to be in contact with the layer 8. Therefore, when the opening 8a is formed in the n-type current confinement layer 8 by PEC (photo-electro-chemical) etching, such as anodic oxidation, or the like, the GaN second semiconductor layer 19, which does not include In, functions as an etch stop layer.

Specifically, if an InGaN layer is provided directly under the n-type current confinement layer 8, the InGaN layer would hardly function as an etch stop layer for PEC etching. Therefore, there is a possibility that the shape of a portion of the diffusion suppressing layer 17 under the opening 8a lacks flatness. For example, side etching readily advances due to the isotropy of wet etching, resulting in an undesirable shape of etching or variations in etching. In view of such, the second semiconductor layer 19 of GaN is provided in the upper level of the diffusion suppressing layer 17, such that the diffusion suppressing layer 17 functions as an etch stop layer.

In the third variation, a p-type impurity (Mg) is intentionally refrained from being added to the first semiconductor layer 18 and the second semiconductor layer 19 during growth of these layers. However, the layers 18 and 19 finally contain the p-type impurity due to the aforementioned memory effect.

The composition ratio of In in the first semiconductor layer 18 is about 4% to 8% in the third variation, although it is not limited to any particular value according to the present invention.

A method for fabricating the semiconductor device wherein the concentration of Mg mixed in the n-type current confinement layer 8 is decreased without decreasing the concentration of Mg added to the first p-type guide layer 7 is described below.

(First Variation of Fabrication Method)

First, the first variation of the fabrication method is described.

Over the primary surface of a substrate 1 placed in a reaction chamber, layers from an n-type GaN layer 2 to an overflow suppressing layer 6 and a first p-type guide layer 7 are epitaxially grown as illustrated in the previously-described example of the present embodiment. Herein, Mg is added as a p-type dopant at the concentration of about $1 \times 10^{19}$ cm$^{-3}$ to the overflow suppressing layer 6 and the first p-type guide layer 7.

After the layers up to the first p-type guide layer 7 have been grown, supply of the Mg source is stopped, and the temperature in the reaction chamber is decreased to a temperature which does not cause thermal degradation of the nitride semiconductor layers. This temperature-decreased condition is maintained for a predetermined interval, for example, about 30 minutes. Herein, the temperature which does not cause thermal degradation of the nitride semiconductor layers is preferably 900° C. or lower. This is because, if the temperature in the reaction chamber is 900° C. or lower, evaporation of Ga from the formed p-type GaN layer is prevented.

Then, the chamber temperature is increased to about 1100° C., which is the growth temperature of the n-type current confinement layer 8, before the n-type current confinement layer 8 is grown. The subsequent steps are the same as those illustrated in the previously-described example of the present embodiment.

According to the first variation of the fabrication method, after the layers up to the first p-type guide layer 7 have been formed, the concentration of Mg remaining in the reaction chamber decreases while the grown layers are left unprocessed for the predetermined interval. With this arrangement, at the subsequent step of growing the n-type current confinement layer 8 over the first p-type guide layer 7, the amount of Mg mixed in the n-type current confinement layer 8 decreases. As a result, the current confinement function of the n-type current confinement layer 8 is improved, whereby the device characteristics are improved.

(Second Variation of Fabrication Method)

First, the second variation of the fabrication method is described.

Over the primary surface of a substrate 1 placed in a reaction chamber, layers from an n-type GaN layer 2 to an overflow suppressing layer 6 and a first p-type guide layer 7 are epitaxially grown as illustrated in the previously-described example of the present embodiment. Herein, Mg is added at the concentration of about $1 \times 10^{19}$ cm$^{-3}$ to the overflow suppressing layer 6 and the first p-type guide layer 7.

After the layers up to the first p-type guide layer 7 have been grown, introduction of TMG, which is the Group III source gas, into the reaction chamber is stopped, while only the hydrogen gas serving as the carrier gas is introduced into the reaction chamber. With this arrangement, thermal cleaning is carried out on the surface of the first p-type guide layer 7. Herein, the partial pressure of the hydrogen gas introduced into the chamber is about 30.4 kPa (=228 Torr). The temperature in the reaction chamber is preferably about 1100° C. during the thermal cleaning.

Then, the n-type current confinement layer 8 is grown over the first p-type guide layer 7. The subsequent steps are the same as those illustrated in the previously-described example of the present embodiment.

According to the second variation of the fabrication method, after the layers up to the first p-type guide layer 7 have been formed, thermal cleaning with hydrogen gas is carried out on the surface of the first p-type guide layer 7. Therefore, the concentration of Mg remaining on the surface of the first p-type guide layer 7 and in the reaction chamber is decreased. With this arrangement, at the subsequent step of growing the n-type current confinement layer 8 over the first p-type guide layer 7, the amount of Mg mixed in the n-type current confinement layer 8 further decreases. As a result, the current confinement function of the n-type current confinement layer 8 is improved, whereby the device characteristics are improved.

As described above, a feature of a semiconductor device and fabrication method thereof according to the present invention is that the concentration of a p-type impurity contained in an n-type nitride semiconductor layer formed over a p-type nitride semiconductor layer so as to be in contact with the p-type nitride semiconductor layer is lower than the concentration of an n-type impurity. This feature enables the n-type nitride semiconductor layer to perform an expected function and is useful for, for example, a semiconductor device including an n-type nitride semiconductor layer grown over a p-type nitride semiconductor layer and a method for fabricating the semiconductor device.

What is claimed is:

1. A semiconductor device, comprising:
   a substrate;
   an active layer formed over the substrate;
   first nitride semiconductor layers formed over the active layer, the first nitride semiconductor layers containing a p-type impurity;
   a second nitride semiconductor layer formed on the first nitride semiconductor layers to be in contact with the first nitride semiconductor layers, the second nitride semiconductor layer containing an n-type impurity; and
   a third nitride semiconductor layer formed between the active layer and the first nitride semiconductor layers, the third nitride semiconductor layer made of AlGaN or GaN and containing an p-type impurity,
   wherein the second nitride semiconductor layer is a current confinement layer which has an opening for allowing a current to selectively flow in the first nitride semiconductor layers,
   the first nitride semiconductor layers include a first layer and a second layer,
   the first layer is formed on a substrate side,
   the second layer is formed between the first layer and the second nitride semiconductor layer,
   the composition of the first layer includes indium, and
   the first layer is a diffusion suppressing layer that suppresses diffusion of the impurity included in the third nitride semiconductor layer.

2. The semiconductor device of claim 1, further comprising a fourth nitride semiconductor layer formed on the second nitride semiconductor layer to fill the opening, the fourth nitride semiconductor layer having a refractive index larger than that of the second nitride semiconductor layer.

3. The semiconductor device of claim 1, wherein the concentration of the p-type impurity in the second nitride semiconductor layer is $1 \times 10^{18}$ cm$^{-3}$ or less.

4. The semiconductor device of claim 1, wherein the p-type impurity is magnesium, and the n-type impurity is silicon.

5. The semiconductor device of claim 1, wherein the first layer of the first nitride semiconductor layers is InGaN.

6. The semiconductor device of claim 5, wherein the second layer of the first nitride semiconductor layers is GaN.

7. The semiconductor device of claim 6, wherein a composition ratio of In in the first layer of the first nitride semiconductor layers is about 4% to 8%.

8. The semiconductor device of claim 1, wherein the impurity included in the third nitride semiconductor layer is magnesium.

9. The semiconductor device of claim 1, wherein the first layer suppresses diffusion of the p-type impurity into the second nitride semiconductor layer.

* * * * *